US009405326B2

(12) United States Patent
Tian et al.

(10) Patent No.: US 9,405,326 B2
(45) Date of Patent: Aug. 2, 2016

(54) CONNECTING DEVICE, ELECTRONIC EQUIPMENT AND NOTEBOOK COMPUTER WITH CONNECTING DEVICE

(75) Inventors: Ping Tian, Beijing (CN); Sébastien Maleville, Beijing (CN)

(73) Assignees: LENOVO (BEIJING) CO., LTD., Haidian District, Beijing (CN); BEIJING LENOVO SOFTWARE LTD., Haidian District, Beijing (CN)

( * ) Notice: Subject to any disclaimer, the term of this patent is extended or adjusted under 35 U.S.C. 154(b) by 186 days.

(21) Appl. No.: 14/126,888

(22) PCT Filed: Jun. 27, 2012

(86) PCT No.: PCT/CN2012/000875
§ 371 (c)(1),
(2), (4) Date: Dec. 17, 2013

(87) PCT Pub. No.: WO2013/000276
PCT Pub. Date: Jan. 3, 2013

(65) Prior Publication Data
US 2014/0118918 A1 May 1, 2014

(30) Foreign Application Priority Data

Jun. 27, 2011 (CN) .......................... 2011 1 0174984
Jan. 9, 2012 (CN) .......................... 2012 1 0004732

(51) Int. Cl.
*G06F 1/16* (2006.01)
*H05K 5/02* (2006.01)
(52) U.S. Cl.
CPC ............ *G06F 1/1683* (2013.01); *G06F 1/1681* (2013.01); *H05K 5/0226* (2013.01); *Y10T 16/532* (2015.01)
(58) Field of Classification Search
CPC .............................. G06F 1/1624; G06F 1/1654

USPC ......................... 361/679.47, 679.41
See application file for complete search history.

(56) References Cited

U.S. PATENT DOCUMENTS 6,163,452 A * 12/2000 O'Neal ................. G06F 1/1616
                                                              312/223.1
6,781,819 B2 * 8/2004 Yang ...................... G06F 1/162
                                                              341/22

(Continued)

FOREIGN PATENT DOCUMENTS

CN          1506790          6/2004
CN          1766783          5/2006

(Continued)

OTHER PUBLICATIONS

PCT/CN2012/000875 International Preliminary Report on Patentability dated Jan. 7, 2014 (16 pages including English translation).

(Continued)

*Primary Examiner* — Anthony Q Edwards
(74) *Attorney, Agent, or Firm* — Brinks Gilson & Lione; G. Peter Nichols

(57) ABSTRACT

The present invention provides a connecting device and electronic equipment with the connecting device. The connecting device includes a first fixed component; a mobile component mounted on the first fixed component; a rotational component connected to the first fixed component by the mobile component, wherein the rotational component could move horizontally with respect to the first fixed component by the mobile component; and a second fixed component connected to the rotational component, wherein the second fixed component could rotate with respect to the first fixed component by the rotational component. The connecting device could achieve the two operations of moving horizontally and rotating synchronously.

32 Claims, 12 Drawing Sheets

(56) References Cited

U.S. PATENT DOCUMENTS

| | | | | |
|---|---|---|---|---|
| 6,989,987 B1* | 1/2006 | Wilson | G06F 1/1601 | 312/223.1 |
| 7,426,406 B2* | 9/2008 | Maatta | G06F 1/1681 | 16/353 |
| 7,623,893 B2 | 11/2009 | Cupps et al. | | |
| 7,787,242 B2* | 8/2010 | Schwager | G06F 1/162 | 361/679.06 |
| 7,796,848 B2 | 9/2010 | Ueno et al. | | |
| 7,936,559 B2* | 5/2011 | Chen | G06F 1/1681 | 16/303 |
| 8,068,334 B2* | 11/2011 | Tang | G06F 1/1616 | 16/345 |
| 8,072,744 B2* | 12/2011 | Wang | G06F 1/1616 | 248/371 |
| 8,077,454 B2* | 12/2011 | Ward | G06F 1/1624 | 361/679.05 |
| 8,208,245 B2* | 6/2012 | Staats | G06F 1/162 | 361/679.02 |
| 8,619,415 B1* | 12/2013 | Lam | G06F 1/1616 | 248/917 |
| 8,644,013 B2* | 2/2014 | Chung | G06F 1/1681 | 16/392 |
| 8,644,018 B2* | 2/2014 | Hung | G06F 1/1632 | 16/302 |
| 8,817,457 B1* | 8/2014 | Colby | G06F 1/1669 | 206/320 |
| 9,072,160 B2* | 6/2015 | Yuan | H05K 7/00 | |
| 2004/0165342 A1* | 8/2004 | Chang | G06F 1/162 | 361/679.27 |
| 2005/0168925 A1* | 8/2005 | Fang | G06F 1/1632 | 361/679.07 |
| 2005/0236869 A1* | 10/2005 | Ka | G06F 1/1616 | 296/192 |
| 2006/0152893 A1* | 7/2006 | Chen | G06F 1/1616 | 361/679.06 |
| 2006/0262496 A1* | 11/2006 | Lee | G06F 1/1616 | 361/679.27 |
| 2007/0076363 A1* | 4/2007 | Liang | G06F 1/1601 | 361/679.29 |
| 2007/0297727 A1 | 12/2007 | Ueno et al. | | |
| 2009/0310292 A1* | 12/2009 | Tian | G06F 1/1654 | 361/679.29 |
| 2010/0016038 A1* | 1/2010 | Demuynck | H04M 1/0216 | 455/575.3 |
| 2010/0118481 A1* | 5/2010 | Wang | G06F 1/1616 | 361/679.27 |
| 2011/0177850 A1* | 7/2011 | Griffin | G06F 1/1616 | 455/575.3 |

FOREIGN PATENT DOCUMENTS

| | | |
|---|---|---|
| CN | 101086682 | 12/2007 |
| CN | 201590015 U | 9/2010 |
| CN | 201741080 U | 2/2011 |

OTHER PUBLICATIONS

First Office Action dated Jun. 5, 2014 in corresponding Chinese Application No. 201110174984.1 (11 pages including English translation).

PCT/CN2012/000875 International Search Report dated Oct. 4, 2012 (6 pages including English translation).

Office Action dated Oct. 13, 2015 out of corresponding Chinese priority Application No. 201210004732.9 (18 pages including English translation).

* cited by examiner

CONNECTING DEVICE, ELECTRONIC EQUIPMENT AND NOTEBOOK COMPUTER WITH CONNECTING DEVICE

This application claims priority to International Application No. PCT/CN2012/000875 filed Jun. 27, 2012; Chinese Patent Appln. 201110174984.1 filed Jun. 27, 2011; and Chinese Patent Appln. 201210004732.9 filed Jan. 9, 2012, the entire contents of each are incorporated herein by reference.

BACKGROUND

The present disclosure relates to a connecting device and a notebook computer, and more particularly, to a connecting device capable of achieving moving horizontally and rotating, an electronic equipment having the connecting device, and a screen-detachable notebook computer.

Portable consumer electronic products such as notebook computers, mobile phones, video cameras, etc. fall into a category of product which is closely related to human's daily life. As technology advances with the times, consumers pay more and more attention to appearances of the products while concerning about their performance. For example, a thin and compact design pleases human aesthetically, brings good portability, and thus is very popular among consumers.

In such electrical products, a connection rotating shaft is a very important component, which makes a great impact on the product form, especially imposes considerable restrictions on appearance design. Take notebook computer as an example: two portions of a conventional connection rotating shaft which rotate around the axis are respectively fixed to a base and a display screen, which remain unchanged with respect to the position of the axis, so that the products present only one single form. What's more, a current trend is that the notebook computers are designed to be thinner and thinner, and the conventional connection rotating shaft imposes some restrictions in this regard. Both product form and appearance design have higher demand for connection rotating shaft.

Therefore, a connecting device is required to reduce restrictions on the product form and the appearance design.

Moreover, good portability is one of selling points of notebook computers, so while the notebook computers are improved in performance, to be thinner and lighter is always a trend of their development.

Along with a development of the semiconductor technology related to storage, and touch screen etc., tablet personal computers are getting more and more popular in recent years. Tablet personal computer takes a touch screen as an input device, which makes the keyboard omitted, and integrates the processor, storage, main board and display into one panel, resulting in a better portability. However, due to restrictions in terms of dimension, thermal dissipation etc., the performance of tablet computers is inevitably limited to some extent.

Accordingly, a novel notebook computer, which combines the conventional notebook computer and tablet computers, has been developed, namely, split-type notebook computers, or referred to as a screen-detachable notebook computer. This type of notebook computers can be used not only as conventional notebook computers, but also as tablet computers directly with the screen detached, which enables this type of notebook computers have advantages of both the conventional notebook computer and the tablet computer.

For example, FIG. 11 illustrates a screen-detachable notebook computer, which includes a base part 1 and a screen part 2 connected to each other by a hinge part 3, and the screen part 2 being detachable from the hinge part 3. However, as shown in FIG. 1, after the screen part 2 is detached from the hinge part 3, the hinge part 3 is protruding on the base part 1. Therefore, the remaining base part 1 and the hinge part 3 are not easy to handle or carry due to their irregular shapes.

Therefore, a novel screen-detachable notebook computer needs to be designed, which can overcome one or more of the above problems and other problems.

SUMMARY

One aspect of the present disclosure is to provide a connecting device, which overcomes one or more defects and restrictions of the connecting devices in the prior art.

One aspect of the present disclosure is to provide a connecting device, which can achieve moving horizontally and rotating at the same time.

One aspect of the present disclosure is to provide a connecting device, which is applicable to design of thinner panel.

One aspect of the present disclosure is to further provide electronic equipment using the connecting device, for example, a notebook computer.

An exemplary embodiment of the present disclosure provides a connecting device, which can include: a first fixed component; a mobile component mounted on the first fixed component; a rotational component connected to the first fixed component by the mobile component, wherein the rotational component can move horizontally with respect to the first fixed component by the mobile component; and a second fixed component connected to the rotational component, wherein the second fixed component can rotate with respect to the first fixed component by the rotational component.

The connecting device can further include an elastic component mounted in the mobile component, so as to provide elastic force to press the mobile component toward the first fixed component.

The mobile component can include: a first sliding component; a second sliding component fitting the first sliding component, the second sliding component moving horizontally with respect to the first sliding component; and a limit component for limiting a distance within which the second sliding component moves horizontally with respect to the first sliding component. The first sliding component can be mounted on the first fixed component. The second sliding component can be mounted on the second rotational component.

The first sliding component can be a sliding cavity of a predetermined shape formed on the first fixed component. The second sliding component can be a sliding body matching with the predetermined shape. A first end of the sliding body can be located inside the sliding cavity, and a second end thereof can be located outside the sliding cavity. The sliding body can move horizontally in an extension direction of the first end and second end inside the sliding cavity.

The limit component includes: an opening formed in the sliding body; and a stopper running through the opening and fixed to the first fixed component, so as to limit the first end of the sliding body inside the sliding cavity.

The connecting device can further include a first elastic component mounted inside the opening. The first elastic component has one end leaning against a side wall of the opening, and has the other end leaning again the stopper, to provide elastic force to pull the sliding body back into the sliding cavity.

The limit component can further include: a bulge formed on a side of the sliding body; and a flange formed at opening of the sliding cavity, to limit the first end of the sliding body inside the sliding cavity.

The connecting device can further include a second elastic component mounted inside the sliding cavity. The second elastic component has one end leaning against the bulge, and has the other end leaning against the flange, to provide elastic force to press the sliding body into the sliding cavity.

The first sliding component can be a sliding cavity formed on the first fixed component, and a flange can be formed at an opening of the sliding cavity. The second sliding component can include a pull rod and a piston formed on an end of the pull rod, the piston and an inner wall of the sliding cavity are airtight sealed, the pull rod and the flange at the opening of the sliding cavity are airtight sealed, and pull rod can pull the piston to move inside the sliding cavity. The flange at an opening of the sliding cavity and the piston can form the limit component. An air pressure of gas sealed in the sliding cavity outside of the piston is higher than an air pressure of gas sealed in the sliding cavity inside of the piston, so that the gas sealed in the sliding cavity outside of the piston forms a third elastic component, which provides elastic force to press the second sliding component into the sliding cavity.

The first sliding component can be two guide rails, which extend in parallel in a same direction on two opposite sides of the first fixed component respectively, each of the guide rails having a groove. The second sliding component can be two bulges fitting the grooves; the two bulges are fixed on two opposite sides of the rotational component, and are respectively inserted into the grooves of the two guide rails so as to move horizontally along the guide rails. The connecting device can further include two fourth elastic components respectively mounted in the grooves of the two guide rails, so as to provide elastic force to press the bulges to the first fixed component.

Another exemplary embodiment of the present disclosure provides electronic equipment, which can be relatively open and closed. The electronic equipment can include: a base portion; a display portion; and a connecting device for connecting the base portion and the display portion, wherein the display portion can move horizontally and rotate with respect to the base portion by the connecting device.

The connecting device can include: a first fixed component fixed to the base portion; a mobile component mounted on the first fixed component; a rotational component connected to the first fixed component by the mobile component, wherein the rotational component can move horizontally with respect to the first fixed component by the mobile component; a second fixed component fixed to the display portion and connected to the rotational component, wherein the second fixed component can rotate with respect to the first fixed component by the rotational component.

The first fixed component can be formed integrally with the base portion. The second fixed component can be formed integrally with the display portion.

A signal can be transmitted between the display portion and the base portion via a flexible cable or Bluetooth.

While the display portion rotates with respect to the base portion by the rotational component, the display portion also moves horizontally with respect to the base portion by the mobile component.

The connecting device can further include an elastic component mounted in the mobile component, so as to provide elastic force to press the mobile component t the first fixed component.

The display portion can have a flange portion formed on one side thereof. The second fixed component is connected to the flange portion. The flange portion and a corresponding side of the base portion can form together a cam pair, so that when the display portion is open, the flange leans against the corresponding side of the base portion, so as to pull the mobile component to move horizontally in a direction away from the base portion.

When the display portion is in a closed state, the flange portion can cover at least a portion of the corresponding side of the base portion.

The flange portion has at least one of a parallelogram, rectangle and arc profile.

Yet another exemplary embodiment of the present disclosure provides electronic equipment. The electronic equipment can include: a base portion; a mobile component mounted on the base portion; a rotational component connected to the base portion by the mobile component, wherein the rotational component can move horizontally with respect to the base portion by the mobile component; a connecting base portion connected to the rotational component, the connecting base portion being rotate with respect to the base portion by the rotational component; and a display portion detachably mounted on the connecting base portion.

The electronic equipment can further include: an elastic component mounted in the mobile component, so as to provide elastic force to press the mobile component toward the first fixed component.

When the display portion is closed with respect to the base portion, the connecting base portion can cover a side of the display portion and the base portion.

The display portion can include a first hardware system and a first system formed based on a first operating system of the first hardware system. The base portion can include a second hardware system and a second system formed based on a second operating system of the second hardware system. When the display portion is detached from the connecting base portion, the display portion can be used as a tablet device; and when the display portion is mounted on the connecting base portion, the first system and the second system form a hybrid system.

The connecting device according to the embodiment of the present disclosure can achieve moving horizontally and rotating at the same time, which thus reduces restrictions on the form of the electronic equipment, e.g., the notebook computer. In addition, the connecting device in the present disclosure is applicable to the design of notebook computers which are thinner and more compact.

Another aspect of the present disclosure is to provide a screen-detachable notebook computer, and after the screen is detached, the remaining components maintain a good integrity.

According to an exemplary embodiment of the present disclosure, there is provided a notebook computer, including: a base part; a middleware connected to the base component by a rotating shaft part; and a display part, detachably mounted in the middleware to be open and closed with respect to the base part, wherein, when the display part is closed with respect to the base part, the middleware covers a same side of the base part and the display part, and when the display part is open in a predetermined angle with respect to the base part, an upper surface of the middleware is substantially coplanar with an upper surface of the base part, and a second size of the middleware in a direction vertical to the upper surface is substantially equal to the thickness of the base part.

In an example, the predetermined angle can be about 90°, and the middleware can have a substantially rectangular cross section.

In an example, when the display part is closed with respect to the base part, a first size of the middleware in a direction of thicknesses of the base part and the display part is substantially equal to a sum of thicknesses of the base part and the display part on the same sides.

In an example, the display part can include a first hardware system and a first operating system based on the first hardware system, and the base part can include a second hardware system and a second operating system based on the second hardware system. When the display part is mounted on the middleware, the display part and the base part form a hybrid system. When the display part is detached from the middleware, the display part can be used as a tablet computer independently.

In an example, the middleware can have a groove, and a buckle provided in the groove, and the display part can be inserted into the groove to be fixed by the buckle.

In an example, the middleware can further have a button provided outside the groove, and the button is linked with the buckle, so that when the button is pressed down, the buckle loosens, then the display part can be detached from the middleware.

In an example, the middleware can further have an elastic part provided in the groove, and the elastic part can apply to the display part an elastic force for ejecting the display part out of the groove.

In an example, the middleware can further have a cover plate provided in the groove, and the cover plate is supported by the elastic part to cover an opening of the groove. The cover plate can further have an opening formed therein, the opening exposing the buckle formed in the groove and/or other structure.

In an example, an electrical connector can be further provided in the groove of the middleware, the electrical connector being connected to the base part via a flexible cable. An edge of the display part to be inserted into the groove can have an interface. When the display part is inserted into the groove of the middleware, the electrical connector is connected to the interface, so that the display part is electrically connected to the base part.

In an example, the display part can be electrically connected to the base part in a wireless manner.

In the present disclosure, after the display part is detached, the remaining middleware and the base part can share substantively coplanar upper surface, and bulges on the upper surface of the base part are eliminated, which thus improves the integrity of the middleware and the base part, to facilitate mobility and portability.

BRIEF DESCRIPTION OF THE DRAWINGS

The aforesaid features and other features of the present disclosure will become more fully understood from the detailed description of the exemplary embodiments of the present disclosure given hereinafter with reference to the accompanying drawings and wherein:

FIG. 8A and FIG. 8B are enlarged cross-sectional diagrams of a connection portion of the notebook computer according to the fifth exemplary embodiment of the present disclosure, wherein FIG. 8A shows a closed state, and FIG. 8B shows an open state;

DETAILED DESCRIPTION

The present disclosure will hereinafter be described in more detail with reference to the drawings, which illustrate the exemplary embodiments of the present disclosure. However, the disclosure can be implemented in various forms, and shall not be construed as limited to the exemplary embodiments disclosed herein. These exemplary embodiments are provided to make the present disclosure thorough and complete, and sufficiently convey a scope of the disclosure to those of skill in the art. In the following description, detailed information of the common technology is omitted to avoid unnecessary misunderstanding of the disclosure. The same or similar reference signs in different drawings identify the same or similar elements.

First Exemplary Embodiment

Figure 1:
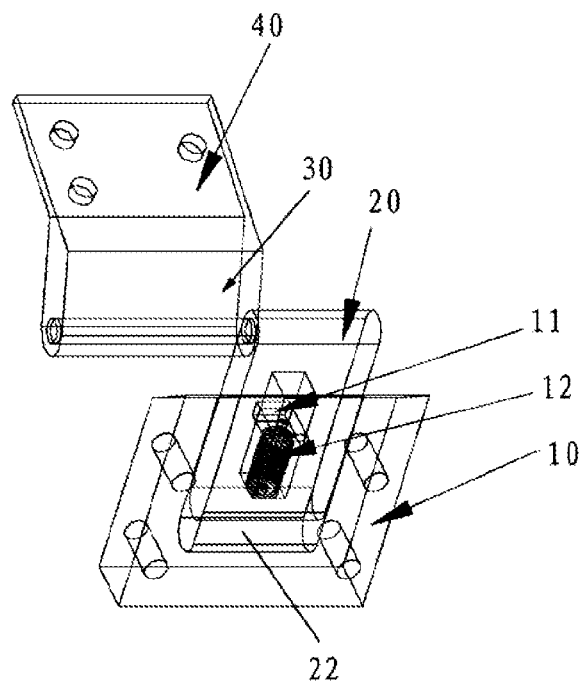
FIG. 1 is a perspective diagram illustrating a connecting device according to a first exemplary embodiment of the present disclosure.
Figure 2:
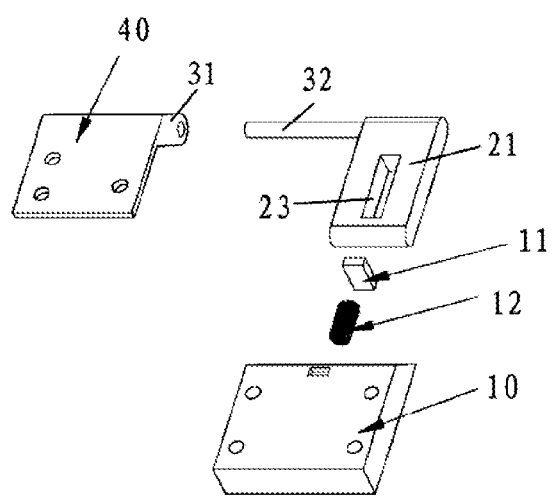
FIG. 2 is a disassembling perspective diagram illustrating respective elements included in the connecting device according to the first exemplary embodiment of the present disclosure.

FIG. 1 is a perspective diagram illustrating a connecting device 100 according to the first exemplary embodiment of the present disclosure; FIG. 2 is a disassembling perspective diagram illustrating respective elements included in the connecting device 100 according to the first exemplary embodiment of the present disclosure.

Referring to FIG. 1 and FIG. 2, the connecting device 100 according to the first exemplary embodiment of the present disclosure includes a first fixed component 10, a mobile component 20, a rotational component 30 and a second fixed component 40.

The first fixed component 10 can be a sliding base, which can be fixed to other components to be connected by the connecting device 100. In an example, the first fixed component 10 can have a through hole for connecting other components by screws. Alternatively, the first fixed component 10 can be connected to other components in other manners such as welding, riveting, splicing and so on.

The mobile component 20 can include: two sliding components capable of moving horizontally with respect to each other, e.g., sliding; and a limit component for limiting a distance within which the two sliding components move horizontally with respect to each other. In the present embodiment, as shown in the drawings, the first sliding component can be a sliding cavity 22 formed in the first fixed component 10. The sliding cavity 22 can have a predetermined shape, for example, but not limited to a rectangle having a chamfer. The second sliding component can be a sliding body 21. A first end of the sliding body 21 can be held in the sliding cavity 22 of the first fixed component 10, and its second end can be located outside the sliding cavity 22. The sliding body 21 can have a predetermined shape, for example, a shape fitting the sliding cavity 22. In this way, the sliding cavity 22 and the sliding body 21 of the first fixed component 10 cooperate with each other, so that the sliding body 21 can perform one-dimensional linear movement inside the sliding cavity 22 in a moving direction same as an extension direction between the first end and second end of the sliding body 21.

In this embodiment, the limit component of the mobile component 20 can be formed as follows. As shown in FIG. 1 and FIG. 2, the sliding body 21 can have an opening 23 formed therein, a stopper 11 can run through the opening 23 and can be fixed to the first fixed component 10, so as to limit one end of the sliding body 21 inside the sliding cavity 22.

Optionally, the connecting device 100 can also include an elastic component, to provide elastic force for pressing the mobile component 20 toward the first fixed component 10. In this embodiment, as shown in FIG. 1 and FIG. 2, the elastic component can be a first elastic component 12 mounted inside the opening 23. The elastic component 12 can be a spring (as shown in the drawings) or any other elastic items like elastic rubber and so on. The elastic component 12 can have one end leaning against a side wall of the opening 23, and the other end leaning again the stopper 11, so as to provide elastic force for pressing the sliding body 21 into the sliding cavity 22. It can be understood that when external force is applied, the elastic force of the elastic component 12 can be overcome to pull the sliding body 21 to move outward horizontally.

The rotational component 30 can be connected to the mobile component 20, so as to move horizontally with respect to the first fixed component by the mobile component 20. In the embodiment, the rotational component 30 can be, for example, a rotating shaft. The rotating shaft generally includes a core shaft, a shaft housing and two fixing plates. The two fixing plates are respectively fixed onto (or are integrally formed with) the core shaft and shaft housing. The shaft housing can be bushed around the core shaft to rotate. The rotating shaft also can include two shaft housings, which both houses the core shaft and respectively are fixed onto the two fixing plates to achieve rotating.

In this embodiment, as shown in FIG. 1 and FIG. 2, the rotational component 30 includes a core shaft 32 and the shaft housing 31. The sliding body 21 and the second fixed component 40 can be used as the above-mentioned two fixing plates. In the embodiment as shown in the drawings, the core shaft 32 can extend from the end of the sliding body 21 outside the sliding cavity, and the shaft housing 31 is formed integrally with the second fixed component 40. The core shaft 32 extends in a direction different from a sliding direction of the sliding body 21. Preferably, the core shaft 32 extends in a direction substantively vertical to the sliding direction of the sliding body 21, but the present disclosure is not limited thereto, the extension direction of the core shaft 32 and the sliding direction of the sliding body 21 can also form any other angle.

In another embodiment not shown, the core shaft 32 can extend from a side of the second fixed component 40, and the shaft housing 31 can be formed integrally at the second end of the sliding body 21.

In yet another embodiment now shown, the rotational component can include two shaft housings. One shaft housing is formed integrally with the second fixed component 40 (as shown in FIGS. 1-2), and the other is formed at the second end of the sliding body 21. The core shaft 32 can be inserted into two shaft housings.

In each embodiment, the shaft housings and the core shaft can be designed in a similar way as the conventional rotating shaft. For example, friction plates are set in the shaft housings to make the rotating shaft more compact. No more description is repeated here.

As shown in FIGS. 1-2, the second fixed component 40 is fixed to (or is formed integrally with) the shaft housing 31, to rotate with respect to the first fixed component 10 by the rotational component 30, and move horizontally with respect to the first fixed component 10 by the mobile component 20. The second fixed component 40 can have a through hole for connecting to other component by screws. Alternatively, the second fixed component 40 can be connected to other components in other manners such as welding, riveting, splicing and so on.

In a variation (not shown) of the first embodiment, the opening 23 can be an un-closed opening, i.e., groove, formed on one side or two sides of the sliding body 21. The elastic component, for example, the first elastic component 12 has one end leaning against the side wall of the opening 23, and the other end leaning against the stopper 11 which runs through the opening 23, so that elastic force is provided to press the sliding body 21 into the sliding cavity 22.

In another variation (not shown), the sliding body 21 can have bulges formed on one side or two sides thereof. There is a flange which covers part of the sliding cavity 22 at the opening of the sliding cavity 22(refer to FIG. 4 for the similar). The second elastic component 12 being an elastic component has one end leaning against the bulges of the sliding body 21, and the other end leaning against the flange at the opening of the sliding cavity 22, to provide elastic force for pressing the sliding body into the sliding cavity 22.

As stated above, in the rotating shaft 100 according to the first exemplary embodiment, the first fixed component 10 can move horizontally and rotate with respect to the second fixed component 40 by the mobile component 20 and the rotational component 30.

Second Exemplary Embodiment

Figure 3:
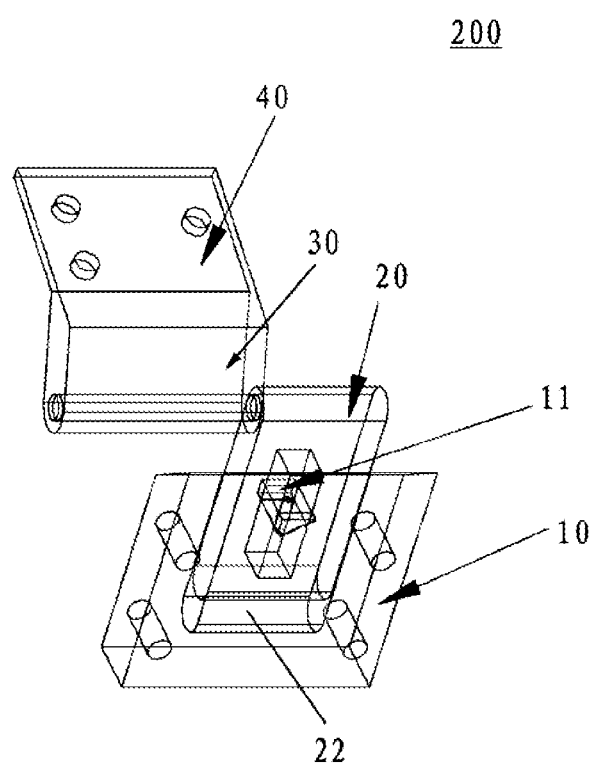
FIG. 3 is a perspective diagram illustrating a connecting device according to a second exemplary embodiment of the present disclosure.

FIG. 3 is a perspective diagram illustrating a connecting device 200 according to the second exemplary embodiment of the present disclosure. The second exemplary embodiment shown in FIG. 3 is basically the same as the exemplary embodiments shown in FIG. 1 and FIG. 2, except that the connecting device 200 does not include an elastic component. Since the components included in the connecting device 200 in the second exemplary embodiment are the same as those in the first exemplary embodiment, no more descriptions will be repeated here.

The first and second exemplary embodiments are compared as follows. In the first exemplary embodiment, the connecting device 100 includes elastic components, e.g., the first and second elastic components 12, which provide elastic force for press the sliding body into the sliding cavity 22. However, the second exemplary embodiment does not include any elastic component. In this case, an external force can be applied to make the sliding body 21 restored to its initial position inside the sliding cavity 22. For example, the sliding body 21 can be returned into the sliding cavity manually.

It can be understood that in the embodiments disclosed above and hereinafter, the elastic component, if any, can be omitted, and alternatively, the mobile component can be restored to the initial position manually.

Third Exemplary Embodiment

Figure 4:
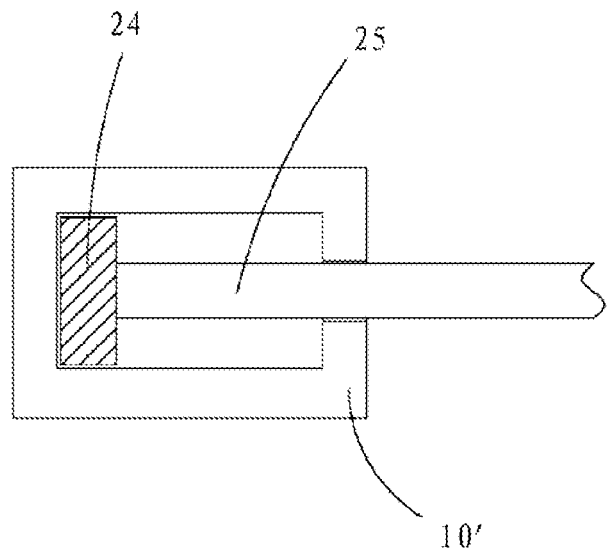
FIG. 4 is a cross-sectional diagram illustrating a connecting device according to a third exemplary embodiment of the present disclosure.

FIG. 4 is a cross-sectional diagram illustrating a connecting device 300 according to the third exemplary embodiment of the present disclosure. It should be noted that FIG. 4 only shows a first fixed component 10' and part of a mobile component, and the other components can be the same as those in the first and second exemplary embodiments, which thus are not shown. And no more descriptions of the same or similar components will be repeated here.

As shown in FIG. 4, a first sliding component can be a sliding cavity formed on the first fixed component 10'. A flange can be formed at the opening of the sliding cavity to cover part of the sliding cavity. Thus, an opening area of the sliding cavity is less than its internal area.

The second sliding component can include a pull rod 25 and a piston 24, the piston 24 being formed at a first end of the pull rod 25 and located inside the sliding cavity. The side of the piston 24 and an inner wall of the sliding cavity are airtight sealed, the side of the pull rod 25 and the flange at the opening of the sliding cavity are airtight sealed, and the pull rod 25 can pull the piston 24 to perform one-dimensional linear movement inside the sliding cavity. The sliding cavity in an outer side of the piston 24 can be sealed with compressed air of high density, and the sliding cavity in an inner side of the piston 24 can be vacuum or is sealed with air of low density. Thus, the compressed air of high density sealed in the sliding cavity outside the piston 24 can form a third elastic component, which can provide elastic force for pressing the second sliding component into the sliding cavity. When external force is applied, the elastic force of the compressed air can be overcome to pull the second sliding component to slide outwards.

It can be understood that in a variation of the third exemplary embodiment, the compressed gas of high density can be replaced with an elastic component. In such a case, it is not necessary that the second sliding component and the first fixed component 10' are airtight sealed.

Fourth Exemplary Embodiment

Figure 5:
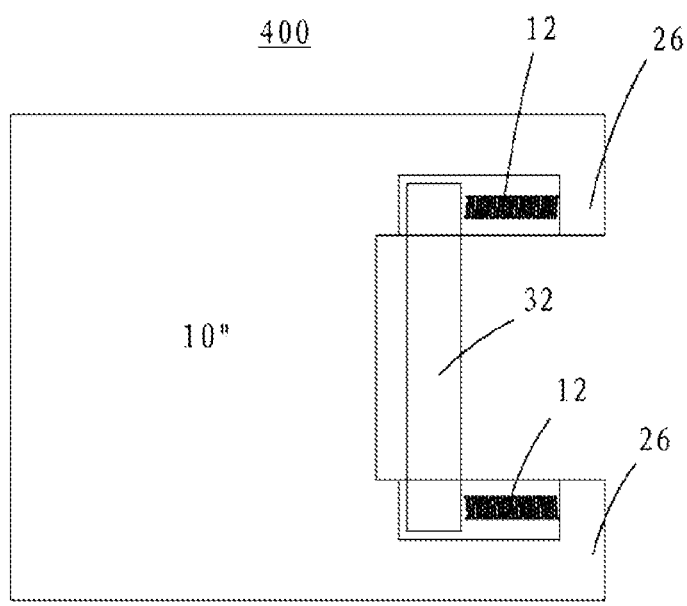
FIG. 5 is a diagram illustrating a connecting device according to a fourth exemplary embodiment of the present disclosure.
Figure 6:
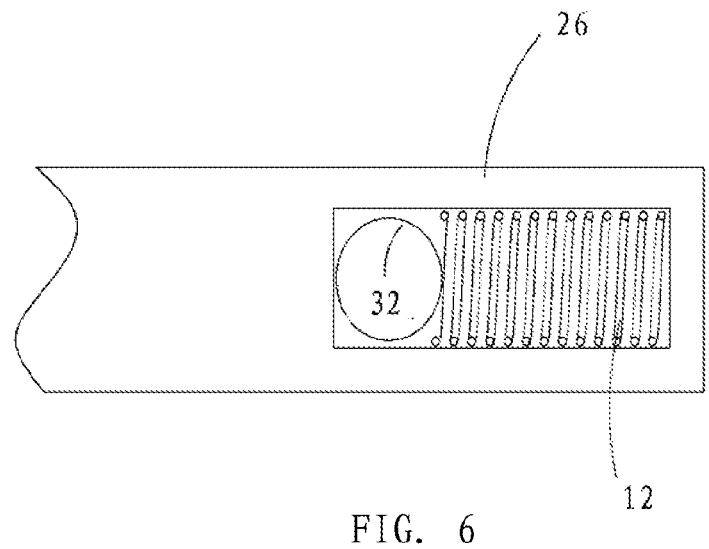
FIG. 6 shows a connection between the rotational component and the mobile component of the connecting device shown in FIG. 5.

FIG. 5 is a diagram illustrating a connecting device 400 according to the fourth exemplary embodiment of the present disclosure; FIG. 6 is a diagram of side view of the mobile component 20 of the connecting device 400 shown in FIG. 5.

It should be noted that FIG. 5 only shows part of the components of the connecting device 400. It can be understood that the other components can be similar to or same as those in the first to third exemplary embodiments. And no more descriptions of the same or similar components will be repeated here.

As shown in FIGS. 5 and 6, the first sliding component can be two guide rails 26 extending in parallel in a same direction on two opposite sides of a first fixed component 10" respectively. Each of the guide rails 26 can form a guide groove. The second sliding component, e.g., two bulges, can be provided in two grooves. Both ends of the core shaft 32 can be connected to the two bulges respectively. Alternatively, the core shaft 32 can be formed integrally with the bulges. The shaft housing (not shown) can be bushed around the core shaft 32.

In one example, the bulges can be, for example, a rectangle or square. Thus, the bulges are limited by the groove and cannot rotate, and further, the core shaft 32 fixed to or formed integrally with the bulges cannot rotate either, the shaft housing bushing around the core shaft 32 can rotate. Friction plates can be set in the shaft housing to provide appropriate damping.

In another example, the bulges can be for example round, which is the same as the core shaft 32. At this time, the core shaft 21 together with the bulges can rotate with respect to the first fixed component 10", and the shaft housing can rotate with respect to the core shaft. At this time, friction plates can be set on the inner wall of the groove and in the shaft housing to provide the desired dumping.

In addition, as shown in the drawing, the elastic components, e.g., two fourth elastic components 12, can be mounted respectively in the grooves of the two guide rails 26 and is in an outer side of the bulge. In this way, when an external force is not applied, the fourth elastic components 12 can press the bulges and the core shaft 32 toward the first fixed component 10"; when an external force is applied, the elastic force can be overcome to pull the core shaft 32 together with the bulges to move in a direction away from the first fixed component 10".

Fifth Exemplary Embodiment

Figure 7:
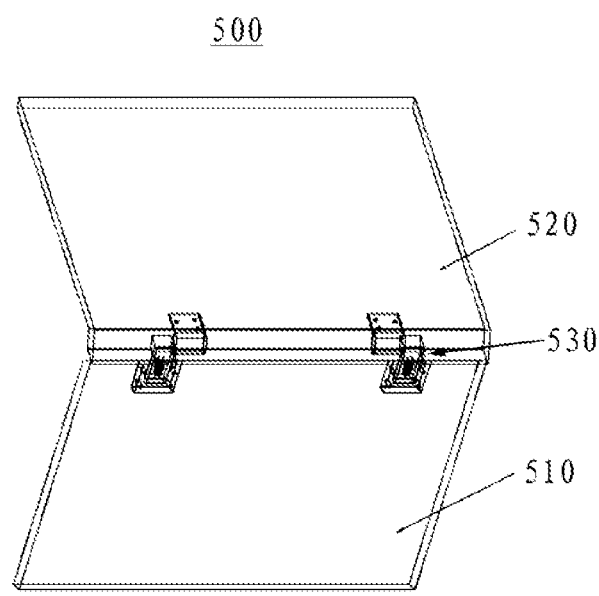
FIG. 7 shows a notebook computer according to a fifth exemplary embodiment of the present disclosure.
Figure 8A:
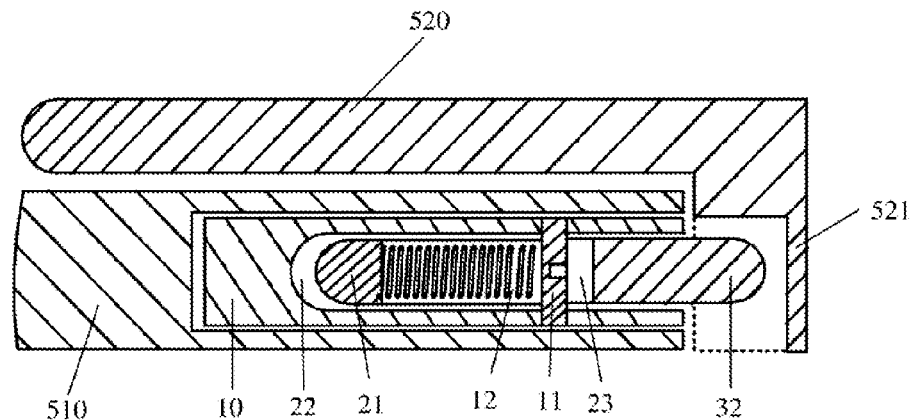
Figure 8B:
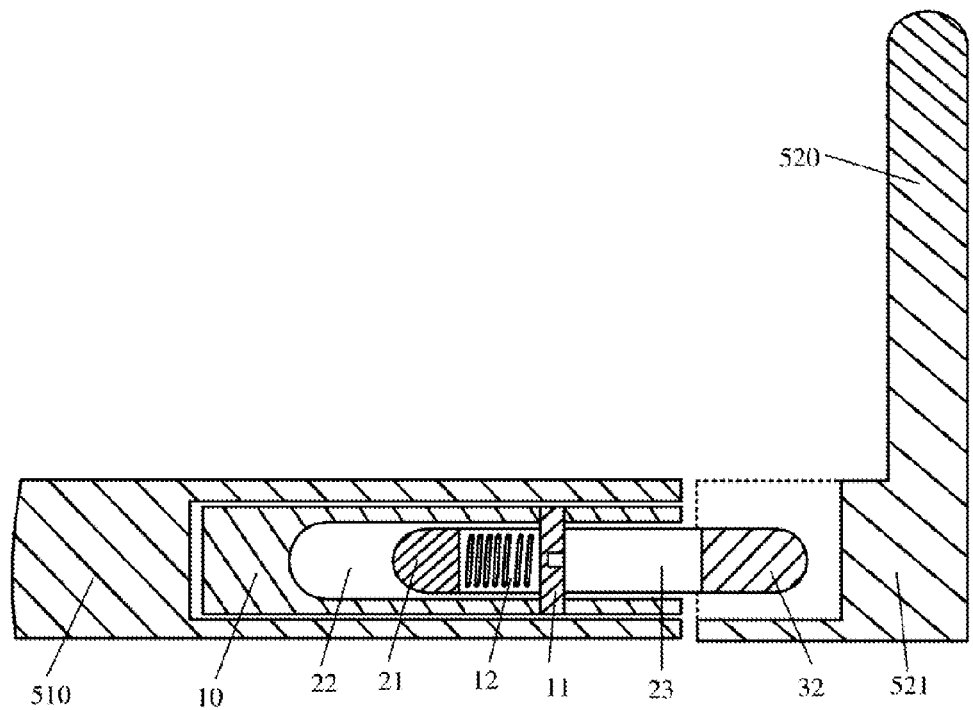

FIG. 7 shows a notebook computer 500 according to the fifth exemplary embodiment of the present disclosure; FIG. 8A and FIG. 8B are enlarged cross-sectional diagrams of a connection portion of the notebook computer 500 according to the fifth exemplary embodiment of the present disclosure, wherein FIG. 8A shows a closed state, and FIG. 8B shows an open state.

As shown in FIG. 7, the notebook computer 500 includes a base portion 510, a display portion 520, and a connecting device 530 for connecting the base portion 510 and the display portion 520. The base portion 510 can have, for example, a keyboard, a touch panel etc. The display portion 520 can include, for example, a liquid crystal display screen. The connecting device 530 can include any connecting device according to the aforesaid embodiments and other embodiments. Thus, the display portion 520 can move horizontally and rotate with respect to the base portion 510 by the connecting device 530.

Now, take the connecting device 100 according to the first exemplary embodiment as an example, the connection between the rotating shaft 530 and the base portion 510/the display portion 520 will be described in details.

As shown in FIGS. 8A-8B, a flange portion 521 is formed on one side of the display portion 520. The flange portion 521 can be formed along the total length of the display portion 520 or at least part of the total length. In a closed state, the flange portion 521 can cover at least part of the corresponding side of the base portion 510. The first fixed component 10 of the connecting device 530 is connected to this side of the base portion 510. The second fixed component 40 (not shown in FIGS. 8A-8B) is connected to the flange portion 521 of the display portion 520. It can be understood that in another exemplary embodiment, the first fixed component 10 of the connecting device 530 can be formed integrally with the base portion 510, and the second fixed component 40 can be formed integrally with the display portion 520.

As shown in FIG. 8A, the flange portion 521 of the display portion 520 can have a relatively high thickness, and in the closed state, the flange portion 521 covers at least part of the side of the base portion 510. The relatively thick flange portion 521 can be securely mounted on the connecting device 530, while the remaining of the display portion 520 can have a relatively low thickness. Thus, the notebook computer 500 according to the fifth exemplary embodiment of the present disclosure can feature an even thinner design in general.

As shown in FIG. 7 and FIG. 8B (FIG. 9 can also be referred to), when the display portion 520 is opened, the flange portion 521 and a corresponding side of the base portion 510 of the display portion 520 can form together a cam pair. Therefore, while the display portion 520 rotates around the core shaft 32, it also pulls the sliding body 21 to overcome the elastic force and move in a direction away from the base portion 510. When the display portion 520 is closed, the sliding body 21 and the core shaft 32 move towards the base portion 510 with elastic force functioned, and the flange portion 521 covers at least part of the corresponding side of the base portion 510. Therefore, the notebook computer 500 looks quite compact and neat.

It can be understood that the base portion 510 and the display portion 530 of the notebook computer 500 can be connected in a wired manner, e.g., connected with flexible cable, or in a wireless manner, e.g., via Bluetooth, to transmit signals.

As described above, the connecting device in the present disclosure may not include an elastic component, e.g., the elastic component 12 as shown in FIGS. 8A-8B. In such a case, the sliding body 21 and the core shaft 32 can be restored to the initial position manually. The connecting device can also be linked to a shackle on the opposite side of the notebook computer. The notebook computer generally includes a shackle on the opposite side of the connecting device 530. When the notebook computer is closed, the shackle locks up the display portion and the base portion, which prevents the display portion from being opened with respect to the base portion unintentionally. When the display portion needs to be opened up, an operating button of the shackle can be slid or pressed, and then the display portion can be rotated to open. The connecting device of this disclosure can be linked to the shackle. When the notebook computer is closed, the mobile component is also fixed at the initial position by a clamping bolt. When the notebook computer is opened, the operating button of the shackle can be slid or pressed, to make the clamping bolt retract by linkage, so that the display portion is rotated to open, and meanwhile the mobile component is pulled back to move horizontally outwards.

Sixth Exemplary Embodiment

Figure 9:
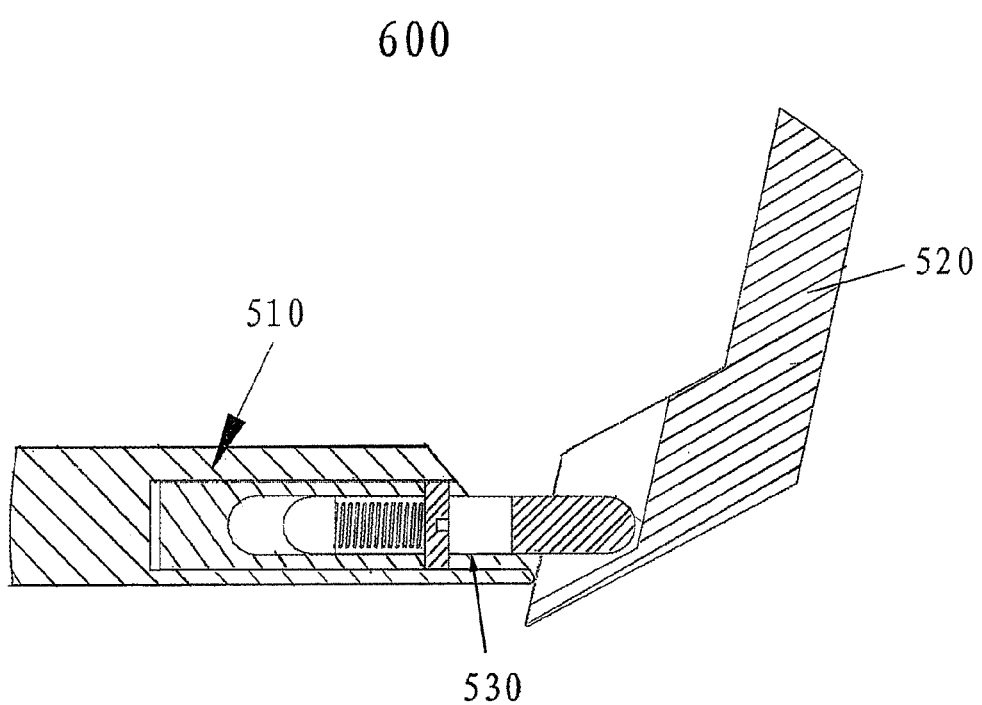
FIG. 9 is an enlarged cross-sectional diagram illustrating a connecting portion of a notebook computer according to a sixth exemplary embodiment of the present disclosure.

FIG. 9 is an enlarged cross-sectional diagram illustrating a connecting portion of a notebook computer 600 according to the sixth exemplary embodiment of the present disclosure. The notebook computer 600 according to the sixth exemplary embodiment of the present disclosure is basically the same as the notebook computer 500 according to the fifth exemplary embodiment thereof, except the shape of the flange portion.

In the notebook computer 500, the flange portion 521 is a rectangle basically, and the base portion 510 has a corresponding side substantively vertical to the upper and lower surfaces. However, in the notebook computer 600 according to the sixth exemplary embodiment of the present disclosure, the flange can have a shape of parallelogram, and the base portion 510 can tilt correspondingly on the corresponding side.

It should be understood that the display portion of the notebook computer of the present disclosure is not limited to the above shapes. Rather, the flange portion also can have profile in other shape, e.g., round, arc, irregular shape and so on. In addition to the aforesaid function for forming a cam pair, the shape of flange can be designed for aesthetic or other considerations.

Seventh Exemplary Embodiment

Figure 10:
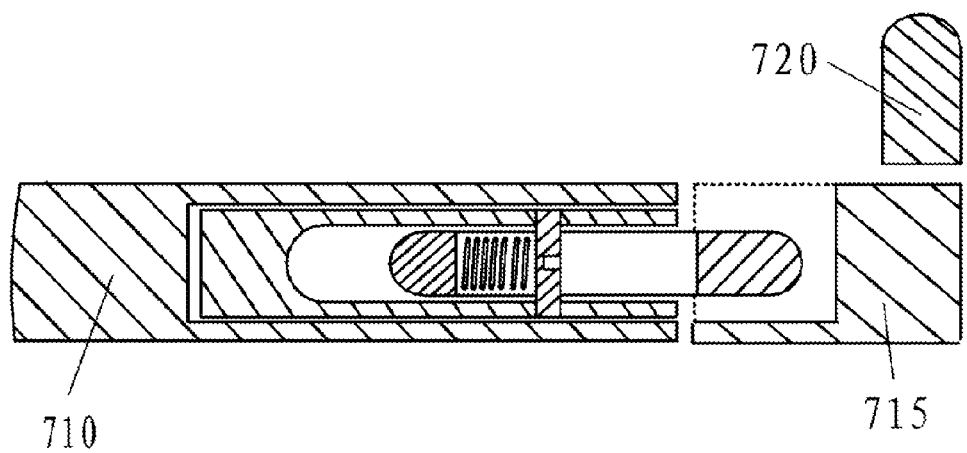
FIG. 10 is an enlarged cross-sectional diagram illustrating a connecting portion of a notebook computer according to a seventh exemplary embodiment of the present disclosure.
Figure 11:
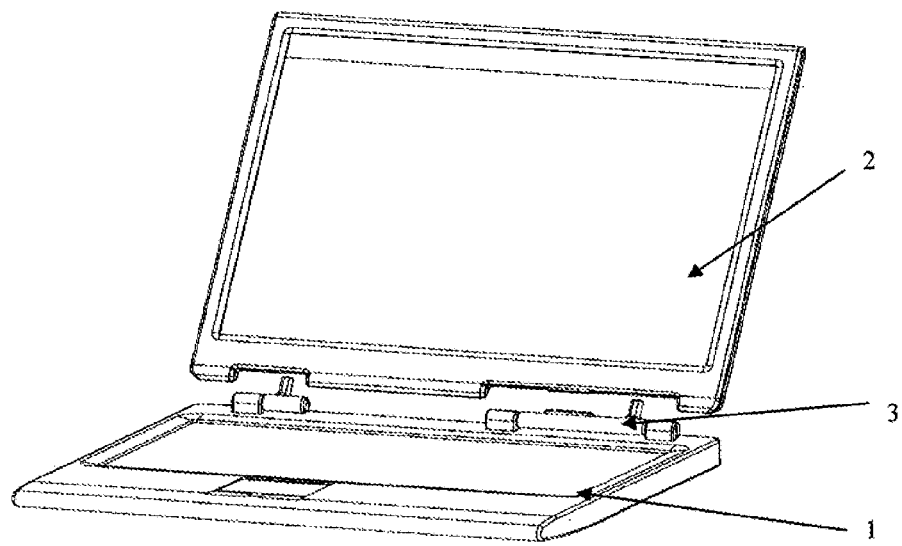
FIG. 11 shows a screen-detachable notebook computer in the prior art.

FIG. 10 is an enlarged cross-sectional diagram illustrating a rotation shaft connecting portion of a notebook computer 700 according to the seventh exemplary embodiment of the present disclosure.

As shown in FIG. 10, the notebook computer 700 includes a base portion 710, a connecting base portion 715, a display portion 720, and a connecting device 730. The connecting base portion 715 can be connected to the base portion 710 by the connecting device 730, so as to move horizontally and rotate with respect to the base portion 710. The display portion 720 can be detachably connected to the connecting base portion 715. After being detached from the connecting base portion 715, the display portion 720 can be used as a tablet device, and the remaining of the connecting base portion 715 together with the base portion 710 can still have a substantively flat upper surface. When mounted onto the connecting base portion 715, the display portion 720 can be used by combining with the base portion 710 to present stronger function.

In one example, the display portion 720 can include a first hardware system and a first system formed based on a first operating system of the first hardware system. The base portion 710 serves as an extended portion of the first system, such as keyboard, touch panel, fingerprint reader, card reader and so on.

In another example, the base portion 710 can include a second hardware system and a second system formed based on a second operating system of the second hardware system. The display portion 720 can serve as an output display portion of the second system.

In yet another example, the display portion 720 can include a first hardware system and a first system formed based on a first operating system of the first hardware system, and the base portion 710 can include a second hardware system and a second system formed based on a second operating system of the second hardware system. When the display portion 720 is mounted on the connecting base portion 715, the first system and the second system form a hybrid system.

The second operating system can be selected from Linux system, Windows system, and MacOS system; and the first operating system can be selected from iOS system, Android system, Symbian system and Windows Phone system, etc.

It should be understood that, although the above description takes the notebook computer as an example, the connecting device in the present disclosure can also be applied to other electronic equipments such as mobile phone, camera and so on.

In addition, although several exemplary embodiments of the present disclosure are described above, it can be understood that the present disclosure is not limited to the disclosed exemplary embodiments, and those of skill in the art can make various changes in form and details within the spirit and scope of the present disclosure. For example, the first fixed component 10 and the mobile component 20 can form a structure similar to a structure of trail-type spring.

Figure 12:
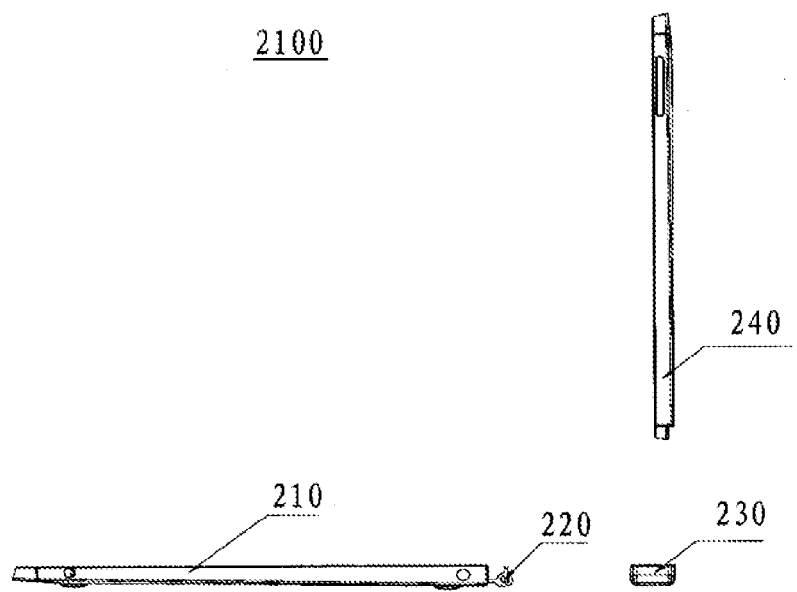
FIG. 12 is a disassembling perspective diagram illustrating a screen-detachable notebook computer according to an exemplary embodiment of the present disclosure.
Figure 13A:
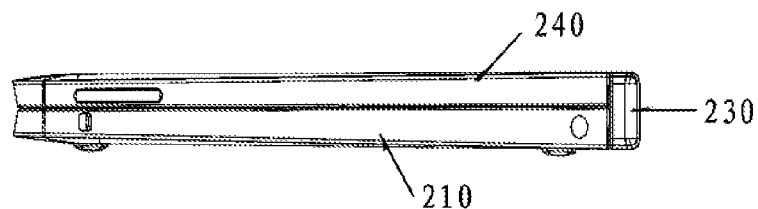
FIG. 13A is a diagram of side view illustrating a screen-detachable notebook computer in a closed state after assembling according to an exemplary embodiment of the present disclosure.
Figure 13B:
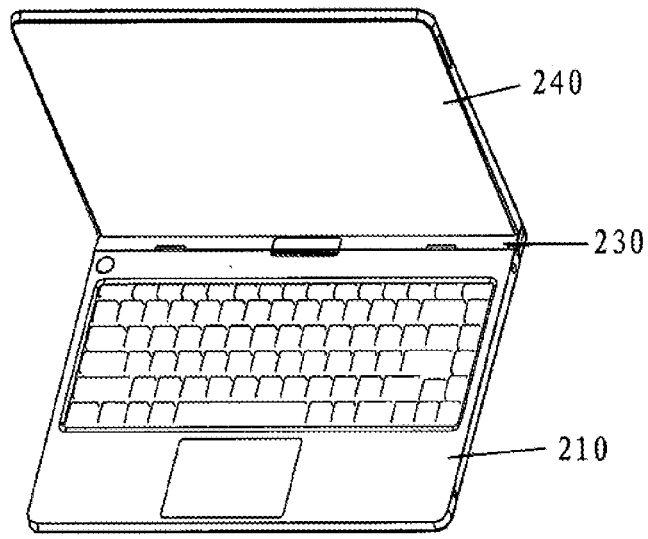
FIG. 13B is a perspective diagram illustrating a screen-detachable notebook computer in an open state after assembling according to an exemplary embodiment of the present disclosure.

FIG. 12 illustrates a disassembling perspective diagram of a screen-detachable notebook computer 2100 according to an exemplary embodiment of the present disclosure; FIG. 13A is a diagram of side view of the screen-detachable notebook computer 2100 in a closed state after being assembled; FIG. 13B is a perspective diagram of the screen-detachable notebook computer 2100 in an open state after being assembled.

As shown in FIG. 12, the screen-detachable notebook computer 2100 according to an exemplary embodiment of the present disclosure can include a base part 210, a middleware 230 and a display part 240. The middleware 230 can be connected to the base part 210 by a rotating shaft part 220, and the display part 240 can be detachably mounted onto the middleware 230, so that the display part 240 together with the middleware 230 can be opened and closed with respect to the base part 210 by the rotating shaft part 220. In a closed state, as shown in FIG. 13A, the middleware 230 can cover the same side of the base part 210 and the display part 240. Preferably, the middleware 230 can have an approximately rectangular cross section, but the present disclosure is not limited thereto. In a direction substantively vertical to the surface where the base part 210 and the display part 240 are located (i.e., in the direction of thickness), a first size of the middleware 230 can be substantially equal to a sum of thicknesses of the base part 210 and the display part 230 on the same sides. The "substantially equal to" here is given considering that there might be a certain gap between the base part 210 and the display part 230. That is to say, in the closed state, the middleware 230 can completely cover this side of the base part 210 and the display part 240.

The display part 240 and the middleware 230 can rotate to open with respect to the base part 210 by the rotating shaft part 220. When rotated in a predetermined angle, as shown in FIG. 13B, an upper surface of the middleware 230 is substantively coplanar with an upper surface of the base portion 210. In a preferred embodiment that the middleware 230 has a rectangular cross section, the predetermined angle can be 90°. It should be understood that, the screen-detachable notebook computer according to the exemplary embodiment of the present disclosure can rotate in various angles greater than or less than the predetermined angle during application, which shall be illustrated later in detail together with the rotating shaft part 220.

Figure 14:
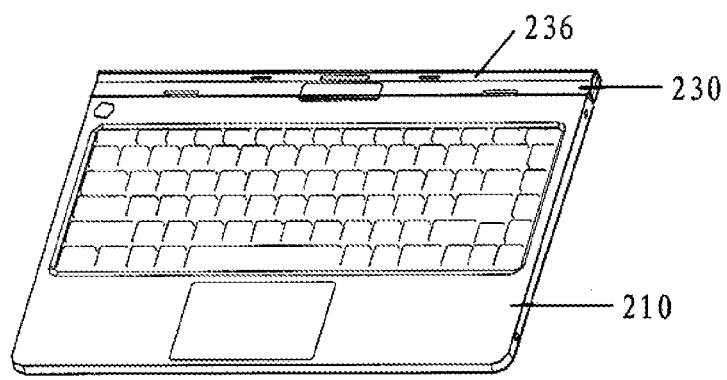
FIG. 14 is a perspective diagram illustrating the remaining portions after the screen is detached.

As described above, the display part 240 can be detached from the middleware 230. The detached display part 240 can be used as a display part of other device, or can be used independently as a tablet computer. FIG. 14 shows the base part 210 and the middleware 230 rotated in a predetermined angle after the display part 240 is detached. As shown in FIG. 14, the upper surface of the middleware 230 is substantively coplanar with the upper surface of the base portion 210. In this way, bulges on the surface of the base part 210 are eliminated; the middleware 230 and the base part 210 present a regular stand-alone whole in appearance, for better mobility and portability. In an exemplary embodiment, a second size of the middleware 230 in a direction vertical to the upper surface can be substantially equal to the thickness of the base part 210 on the side. Thus, the middleware 230 can be taken as an extension of the base part 210 to further enhance the visual integrity.

Figure 15:
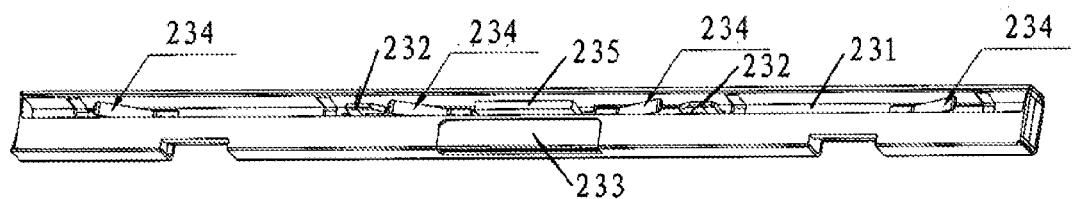
FIG. 15 is a perspective diagram illustrating the structure of the middleware according to an exemplary embodiment of the present disclosure.

FIG. 15 shows a structural example of the middleware 230. As shown in FIG. 15, the middleware 230 can have a groove 231 formed therein, the display part 240 can be inserted into the groove 231, and the edge of the display part 240 can be held by the side wall of the groove 231. In this way, when rotating, the edge of the display part 240 and the side wall of the groove 231 shall bear even force, to avoid connection damage between the two.

Referring further to FIG. 15, a buckle structure 232 can be provided in the groove 231, a snap hole or slot structure (not shown) corresponding to the buckle structure 232 can be formed on a corresponding edge of the display part 240. When the display part 40 is inserted into the groove 231, the buckle structure 232 can stick onto the display part 240 by the snap hole or slot structure on the display part 240. In this way, the display part 240 can be fixed inside the groove 231.

In addition, the middleware 230 also can be provided with a button 233 linked to the buckle structure 232. When the button 233 is pressed down, the buckle structure 232 loosens to release the display part 240, so that the display part 240 can be detached from the middleware 230. The buckle structure 232, snap hole or slot structure (not shown), and the button 233 are structures well known for those of skill in the art, can be realized in various manners, and are not limited to the shapes shown in the drawings. Therefore, a detailed description of these components is omitted here.

Alternatively but not necessarily, as shown in FIG. 15, one or more elastic components 234 can also be provided in the groove 231 of the middleware 230. When the display part 240 is being mounted, the elastic force of the elastic component 234 needs to be overcome to press the display part 240 into the groove 231; when the display part 240 is being detached, only the button 233 needs to be pressed down, then the elastic component 234 can eject the display part 240 outwards. Thus, the close fitting between the display part 240 and the groove 231 can be enhanced; the detaching of the display part 240 is facilitated also. In an exemplary embodiment, the elastic component 234 can be, for example, a spring, which is thin in thickness to save the space for the display part 240 to be inserted.

An electrical connector 235 can also be provided in the groove 231 of the middleware 230, and the electrical connector 235 can be connected to the base part 210 via a flexible cable (not shown). When the display part 240 is inserted into the groove 231, the electrical connector 235 can be inserted into an interface of the edge of the display part 240, so that the display part 240 can be electrically connected to the base part 210. It can be appreciated that the display part 240 also can be electrically connected to the base part 210 in a wireless manner, e.g., via Bluetooth etc.

In an exemplary embodiment, the middleware 230 can further have a cover plate 236 (refer to FIG. 14) in the groove 231. The cover plate 236 can be supported by the elastic component 233 to cover an opening of the groove 231. In this way, after the display part 240 is detached, it can prevent the groove 231 from being exposed, so as to improve integrity of the middleware 230 and the base part 210. The cover plate 236 can have an opening, so that when the cover plate 236 is pressed down, the components in the groove 231 such as the buckle structure 232 and the electrical connector 234 can be exposed, and thus the mounting of the display part 240 shall not be affected. A limit component (not shown) can be provided at the opening of the groove 231 to limit the cover plate 236 inside the groove 231, i.e., the cover plate 236 is prevented from being ejected out of the groove 231 by the elastic component 233.

Returning to FIG. 13A, the middleware 230 can have a rectangular cross section, which contributes to integrity of the components when disassembled and assembled. However, when the middleware 230 is rotated with respect to the base part 210, the rectangular corner may collide with the side of the base part 110, and thus the rotation is blocked.

Therefore, according to an exemplary embodiment of the present disclosure, the rotating shaft part 220 not only can rotate, but also can move horizontally.

Figure 16:
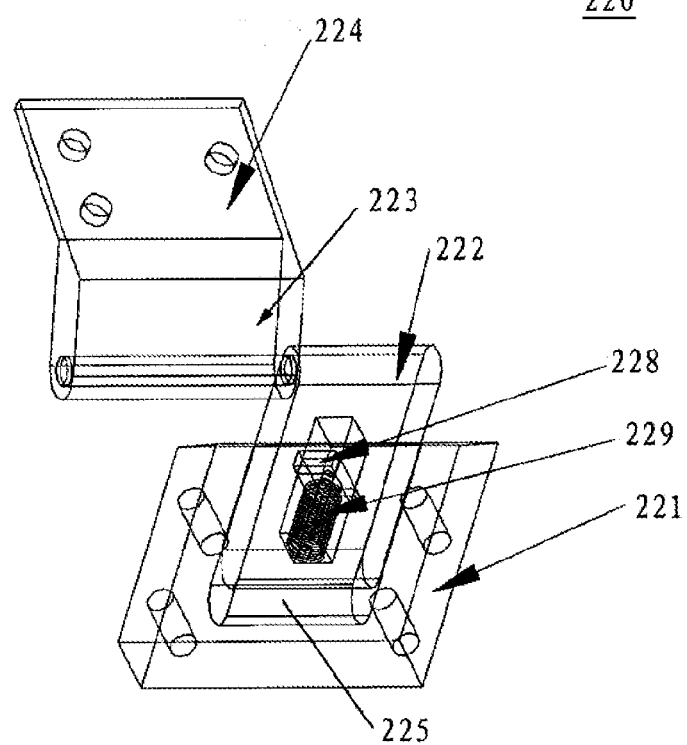
FIG. 16 is a perspective diagram of assembly of a rotating shaft part according to an exemplary embodiment of the present disclosure.
Figure 17:
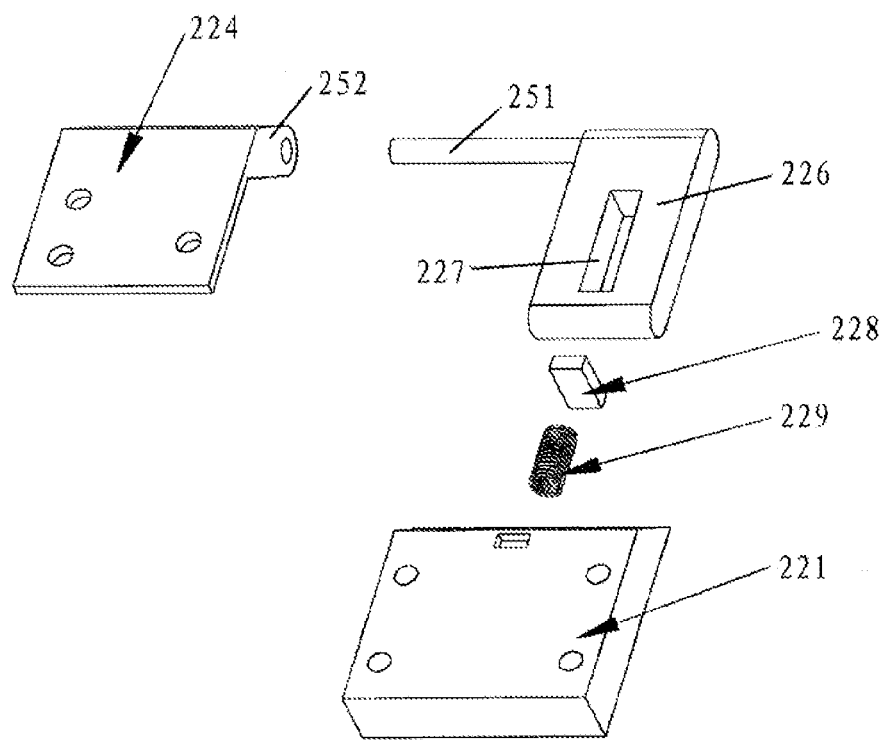
FIG. 17 is a perspective diagram of disassembly of the rotating shaft part according to an exemplary embodiment of the present disclosure.

FIG. 16 is a perspective diagram of assembly of the rotating shaft part 220 according to an exemplary embodiment of the present disclosure; FIG. 17 is a perspective diagram of disassembly of the rotating shaft part 220.

Referring to FIG. 16 and FIG. 17, the rotating shaft part 220 according to an exemplary embodiment of the present disclosure includes a first fixed component 221, a mobile component 222, a rotational component 223 and a second fixed component 224.

The first fixed component 221 can be a sliding base, which can be fixed to one of the base part 210 and the middleware 230, and the second fixed component 224 can be fixed to the other of the base part 210 and the middleware 230. For convenience, the following description is given by taking the first fixed component 221 being fixed to the base part 210 and the second fixed component 224 being fixed to the middleware 230 as an example. In an example, the first fixed component 221 can have a through hole for connecting to the base part 210 by screws. Alternatively, the first fixed component 221 can be connected to the base part 210 in other manners such as welding, riveting, splicing and so on. Or, the first fixed component 221 can be formed integrally with the base part 210.

The mobile component 222 can include: two sliding components capable of moving horizontally with respect to each other, e.g., sliding; and a limit component for limiting the distance within which the two sliding components move horizontally with respect to each other. In the present embodiment, as shown in the drawings, the first sliding component can be a sliding cavity 225 formed in the first fixed component 221. The sliding cavity 225 can have a predetermined shape, for example, but not limited to a rectangle having a chamfer. The second sliding component can be a sliding body 226. A first end of the sliding body 226 can be held in the sliding cavity 225 of the first fixed component 221, and its second end can be located outside the sliding cavity 225. The sliding body 226 can have a predetermined shape, for example, a shape fitting the sliding cavity 225. In this way, the sliding cavity 225 and the sliding body 226 of the first fixed component 221 cooperate with each other, so that the sliding body 226 can perform one-dimensional linear movement inside the sliding cavity 225 in a moving direction the same as an extension direction between the first end and second end of the sliding body 226.

In this embodiment, the limit component of the mobile component 222 can be formed in the following way. As shown in FIG. 16 and FIG. 17, the sliding body 226 can have an opening 227 formed therein, a stopper 228 can run through the opening 227 and can be fixed to the first fixed component 221, so that one end of the sliding body 226 is limited inside the sliding cavity 225.

Optionally, the rotating shaft part 220 can further include an elastic component 229, so that an elastic force is provided for pressing the mobile component 222 toward the first fixed component 221. In this embodiment, as shown in FIG. 16 and FIG. 17, the elastic component 229 can be a spring or any other elastic items like elastic rubber and so on provided in the opening 227. The elastic component 229 can have one end leaning against a side wall of the opening 227, and the other end leaning again the stopper 228, so that an elastic force is provided for pressing the sliding body 226 inside the sliding cavity 225. It can be understood that when external force is applied, the elastic force of the elastic component 229 can be overcome to pull the sliding body 226 to move outward horizontally.

The rotational component 223 can be connected to the mobile component 222, to move horizontally with respect to the first fixed component by the mobile component 222. In the embodiment, the rotational component 223 can be, for example, a rotating shaft. The rotating shaft generally includes a core shaft, a shaft housing and two fixing plates. The two fixing plates are respectively fixed onto (or are integrally formed with) the core shaft and shaft housing. The shaft housing can be bushed around the core shaft to rotate. The rotating shaft also can include two shaft housings, both of which house the core shaft and are respectively fixed onto the two fixing plates to achieve rotating.

In this embodiment, as shown in FIG. 16 and FIG. 17, the rotational component 223 includes a core shaft 223 and the shaft housing 252. The sliding body 226 and the second fixed component 224 can be used as the above-mentioned two fixing plates. In the embodiment as shown in the drawings, the core shaft 251 can extend from the end of the sliding body 226 outside the sliding cavity, and the shaft housing 252 is formed integrally with the second fixed component 224. The core shaft 251 extends in a direction different from a sliding direction of the sliding body 226. Preferably, the core shaft 251 extends in a direction substantively vertical to the sliding direction of the sliding body 226, but the present disclosure is not limited thereto, the extension direction of the core shaft 251 and the sliding direction of the sliding body 26 can also form any other angle.

In another embodiment not shown, the core shaft 251 can extend from the side of the second fixed component 224, and the shaft housing 252 can be formed integrally at the second end of the sliding body 226.

In yet another embodiment now shown, the rotational component can include two shaft housings. One shaft housing is formed integrally with the second fixed component 224 (as shown in FIGS. 16-17), and the other is formed at the second end of the sliding body 226. The core shaft 251 can be inserted into two shaft housings In each embodiment, the shaft housings and the core shaft can be designed in a similar way as the conventional rotating shaft. For example, friction plates are set in the shaft housings to make the rotating shaft more compact. No more description is repeated here.

As shown in FIGS. 16-17, the second fixed component 224 is fixed to (or is formed integrally with) the shaft housing 252, so as to rotate with respect to the first fixed component 221 by the rotational component 223, and move horizontally with respect to the first fixed component 221 by the mobile component 222. The second fixed component 224 can have a through hole for connecting to the middleware 230 by screws. Alternatively, the second fixed component 224 can be connected to the middleware 230 in other manners such as welding, riveting, splicing and so on. Or, the second fixed component 224 can be formed integrally with the middleware 230.

In a variation (not shown) of the above embodiment, the opening 227 can be an un-closed opening, i.e., groove, formed on one side or two sides of the sliding body 226. The elastic component 229 has one end leaning against the side wall of the opening 227, and the other end leaning against the stopper 228 which runs through the opening 227, so that an elastic force is provided for pressing the sliding body 226 into the sliding cavity 225.

It should be noted that, under the teaching of the above disclosure, those of skill in the art can make various modifications to the structure of the above components without departing from the spirit and scope of the present disclosure, and such modifications all fall into the scope of the present disclosure defined by the attached claims.

Figure 18A:
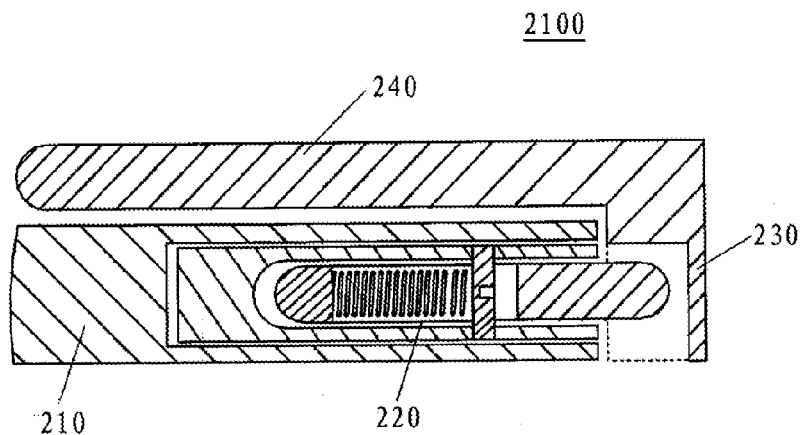
FIG. 18A is a cross-sectional diagram illustrating a tight connection between the middleware and the base part by the rotating shaft part.
Figure 18B:
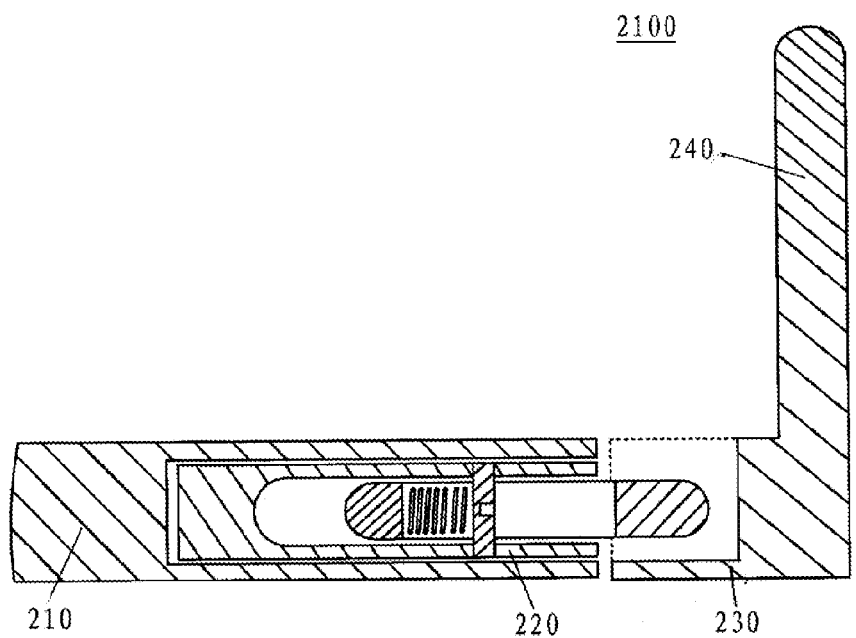
FIG. 18B is a cross-sectional diagram illustrating a state in which the middleware and the display part rotate in a predetermined angle with respect to the base part.

As mentioned above, in the screen-detachable notebook computer 2100 according to an exemplary embodiment of the present disclosure, the rotating shaft part 220 not only can rotate, but also can move horizontally. Thus, as shown in the cross-sectional diagram of the rotating shaft part 220 in FIG. 18A, when the display part 240 drives the middleware 230 to rotate, a bottom corner of the middleware 230 adjacent to the base part 210 and the edge of the base part 210 form a cam pair, so that while rotating, the middleware 230 moves horizontally away from the base part 210. As shown in FIG. 18B, when rotating to about 90°, the upper surface of the middleware 230 is substantively coplanar with the upper surface of the base part 210. Then, if rotating continuously, a corner of the middleware 230 adjacent to the aforesaid bottom corner and the edge of the base part 210 form a cam pair, so that while rotating, the middleware 230 moves horizontally away from the base part 210. In conjunction with FIG. 15, it can be understood that the edge of the middleware 230 connected to the rotating shaft part 220 can be formed to have a groove, so that while rotating, the edge of the middleware 230 shall not collide with the sliding body 226 of the rotating shaft part 220. The opening and closing processes are done basically in symmetry, so there is no further description.

By using the rotating shaft part 220 of the exemplary embodiment, the middleware 230 and the base part 210 can be mounted together in a compact and neat manner, without affecting relative rotation of the two. However, it should be appreciated that the present disclosure is not limited to the aforesaid rotating shaft part which can not only rotate but also move horizontally, but can also make use of a conventional rotating shaft part which only provides rotating function. Then, the middleware 230 can be mounted with a predetermined gap with respect to the base part 210, and the lower edge of the middleware 230 (in the closed state) can be rounded, without affecting the relative rotation between the middleware 230 and the base part 210.

In one example, the display part 240 can include a first hardware system and a first system formed based on a first operating system of the first hardware system. The base part 210 can serve as an extended portion of the first system, such as keyboard, touch panel, fingerprint reader, card reader and so on.

In another example, the base part 210 can include a second hardware system and a second system formed based on a second operating system of the second hardware system. The display part 240 can serve as an output display portion of the second system.

In yet another example, the display part 240 can include a first hardware system and a first system formed based on a first operating system of the first hardware system, and the base part 210 can include a second hardware system and a second system formed based on a second operating system of the second hardware system. When the display part 240 is mounted on the middleware 230, the first system and the second system form a hybrid system.

The first and second operating systems can be selected from Linux system, Windows system, MacOS system, iOS system, Android system, Symbian system and Windows Phone system, etc.

Although several exemplary embodiments of the present disclosure are described above, it can be understood that the present disclosure is not limited to the disclosed exemplary embodiments, and those of skill in the art can make various changes in form and details within the spirit and scope of the present disclosure. For example, the connecting device, electronic equipment with the connecting device, and the notebook computer according the above embodiments of the present disclosure not only can be used as separate solutions, but also can serve as solutions dependent to one another. The present disclosure is intended to cover all of such variations and modifications. And the spirit and scope of the present disclosure are merely defined by the attached claims and equivalents.

The invention claimed is:

1. A connecting device, comprising:
   a first fixed component;
   a mobile component mounted on the first fixed component;
   a rotational component connected to the first fixed component by the mobile component, the rotational component being capable of moving horizontally with respect to the first fixed component by the mobile component; and
   a second fixed component connected to the rotational component, the second fixed component being capable of rotating with respect to the first fixed component by the rotational component further comprising an elastic component mounted in the mobile component, for providing an elastic force to press the mobile component toward the first fixed component.

2. The connecting device according to claim 1, wherein, the mobile component comprises:
   a first sliding component;
   a second sliding component fitting the first sliding component, the second sliding component moving horizontally with respect to the first sliding component; and
   a limit component for limiting a distance within which the second sliding component moves horizontally with respect to the first sliding component,
   wherein the first sliding component is mounted on the first fixed component, the second sliding component is mounted on the second rotational component.

3. The connecting device according to claim 2, wherein, the first sliding component is a sliding cavity having a predetermined shape formed on the first fixed component;
   the second sliding component is a sliding body matching with the predetermined shape; and
   a first end of the sliding body is located inside the sliding cavity, a second end of the sliding body is located outside the sliding cavity, and the sliding body is capable of moving horizontally in an extension direction of the first end and second end inside the sliding cavity.

4. The connecting device according to claim 3, wherein the limit component comprises an opening formed in the sliding body and a stopper running through the opening and fixed to the first fixed component, for limit the first end of the sliding body inside the sliding cavity.

5. The connecting device according to claim 4, further comprising a first elastic component mounted inside the opening, the first elastic component having one end leaning against a side wall of the opening, and the other end leaning again the stopper, so as to provide elastic force for pulling the sliding body back into the sliding cavity.

6. The connecting device according to claim 3, wherein the limit component comprises a bulge formed on a side of the sliding body and a flange formed at an opening of the sliding cavity, for limiting the first end of the sliding body inside the sliding cavity.

7. The connecting device according to claim 6, further comprising a second elastic component mounted inside the sliding cavity, the second elastic component having one end leaning against the bulge, and the other end leaning against the flange, to provide elastic force for pressing the sliding body into the sliding cavity.

8. The connecting device according to claim 2, wherein, the first sliding component is a sliding cavity formed on the first fixed component, a flange is formed at an opening of the sliding cavity;
the second sliding component includes a pull rod and a piston formed on an end of the pull rod, the piston and an inner wall of the sliding cavity are airtight sealed, the pull rod and the flange at the opening of the sliding cavity are airtight sealed, and the pull rod is capable of pulling the piston to move inside the sliding cavity;
the flange at the opening of the sliding cavity and the piston form the limit component,
an air pressure of gas sealed in the sliding cavity outside of the piston is higher than an air pressure of gas sealed in the sliding cavity inside of the piston, so that the gas sealed in the sliding cavity outside of the piston forms a third elastic component, which provides elastic force for pressing the second sliding component into the sliding cavity.

9. The connecting device according to claim 2, wherein, the first sliding component comprises two guide rails extending in parallel in a same direction on two opposite sides of the first fixed component respectively, each of the guide rails having a groove;
the second sliding component comprises two bulges fitting the grooves, the two bulges are fixed on two opposite sides of the rotational component, and are respectively inserted into the grooves of the two guide rails so as to move horizontally along the guide rails.

10. The connecting device according to claim 9, further comprising two fourth elastic components respectively mounted in the grooves of the two guide rails, so as to provide elastic force for pressing the bulges toward the first fixed component.

11. An electronic equipment capable of being relatively open and closed, comprising:
a base portion;
a display portion; and
a connecting device for connecting the base portion and the display portion, wherein the connecting device further includes an elastic component mounted in the mobile component, so as to provide elastic force for pressing the mobile component toward the first fixed component,
wherein the display portion being capable of moving horizontally and rotating with respect to the base portion by the connecting device wherein the connecting device includes: a first fixed component fixed to the base portion; a mobile component mounted on the first fixed component; a rotational component connected to the first fixed component by the mobile component, the rotational component being capable of moving horizontally with respect to the first fixed component by the mobile component a second fixed component fixed to the display portion and connected to the rotational component, the second fixed component being capable of rotating with respect to the first fixed component by the rotational component.

12. The electronic equipment according to claim 11, wherein the first fixed component is formed integrally with the base portion, and the second fixed component is formed integrally with the display portion.

13. The electronic equipment according to claim 11, wherein a signal is transmitted between the display portion and the base portion via a flexible cable or Bluetooth.

14. The electronic equipment according to claim 11, wherein, while the display portion rotates with respect to the base portion by the rotational component, the display portion also moves horizontally with respect to the base portion by the mobile component.

15. The electronic equipment according to claim 14, wherein the display portion has a flange portion formed on one side thereof, and the second fixed component is connected to the flange portion.

16. The electronic equipment according to claim 15, wherein the flange portion and a corresponding side of the base portion together form a cam pair, so that while the display portion is open, the flange leans against the corresponding side of the base portion to pull the mobile component to move horizontally in a direction away from the base portion.

17. The electronic equipment according to claim 15, wherein, when the display portion is in a closed state, the flange portion covers at least a portion of the corresponding side of the base portion.

18. The electronic equipment according to claim 15, wherein the flange portion has at least one of a parallelogram, rectangle and arc profile.

19. An electronic equipment, comprising:
a base portion;
a mobile component mounted on the base portion;
a rotational component connected to the base portion by the mobile component, the rotational component be capable of moving horizontally with respect to the base portion by the mobile component;
a connecting base portion connected to the rotational component, the connecting base portion be capable of rotating with respect to the base portion by the rotational component; and
a display portion detachably mounted on the connecting base portion.

20. The electronic equipment according to claim 19, further comprising an elastic component mounted in the mobile component, for providing elastic force to press the mobile component toward the first fixed component.

21. The electronic equipment according to claim 19, wherein, when the display portion is closed with respect to the base portion, the connecting base portion covers sides of the display portion and the base portion.

22. The electronic equipment according to claim 19, wherein the display portion includes a first hardware system and a first system formed based on a first operating system of the first hardware system; the base portion includes a second hardware system and a second system formed based on a second operating system of the second hardware system, and
when the display portion is detached from the connecting base portion, the display portion is used as a tablet device; and when the display portion is mounted on the connecting base portion, the first system and the second system form a hybrid system.

23. A notebook computer, comprising:
a base part;
a middleware connected to the base component by a rotating shaft part; and
a display part detachably mounted onto the middleware to be open and closed with respect to the base part,
wherein, when the display part is closed with respect to the base part, the middleware covers same sides of the base part and the display part, and
when the display part is open in a predetermined angle with respect to the base part, an upper surface of the middleware is substantially coplanar with an upper surface of the base part, and a size of the middleware in a direction vertical to the upper surface is substantially equal to a thickness of the base part.

24. The notebook computer according to claim 23, wherein, when the display part is closed with respect to the base part, a first size of the middleware in a direction of thicknesses of the base part and the display part is substantially equal to a sum of thicknesses of the base part and the display part on the same sides.

25. The notebook computer according to claim 23, wherein the display part includes a first hardware system and a first operating system based on the first hardware system; the base part includes a second hardware system and a second operating system based on the second hardware system, and
when the display part is mounted on the middleware, the display part and the base part form a hybrid system, and
when the display part is detached from the middleware, the display part is used as a tablet computer independently.

26. The notebook computer according to claim 23, wherein the middleware has a groove and a buckle provided in the groove, the display part is capable of being inserted into the groove to be fixed by the buckle.

27. The notebook computer according to claim 26, wherein the middleware further has a button provided outside the groove, when the button is pressed down, the buckle loosens, so that the display part is capable of being detached from the middleware.

28. The notebook computer according to claim 27, wherein the middleware further has an elastic part provided in the groove, the elastic part applying to the display part an elastic force for ejecting the display part out of the groove.

29. The notebook computer according to claim 28, wherein the middleware further has a cover plate provided in the groove, the cover plate is supported by the elastic part to cover an opening of the groove, and the cover plate further has an opening formed therein, the opening exposing the buckle formed in the groove.

30. The notebook computer according to claim 26, wherein an electrical connector is further provided in the groove of the middleware, the electrical connector being connected to the base part via a flexible cable,
an edge of the display part to be inserted into the groove has an interface, and
when the display part is inserted into the groove of the middleware, the electrical connector is connected to the interface, so that the display part is electrically connected to the base part.

31. The notebook computer according to claim 23, wherein the predetermined angle is 90°, and the middleware has a rectangular cross section.

32. The notebook computer according to claim 23, wherein the display part is electrically connected to the base part in a wireless manner.

* * * * *